(12) United States Patent
Wu et al.

(10) Patent No.: US 6,907,379 B1
(45) Date of Patent: Jun. 14, 2005

(54) SYSTEM AND METHOD FOR PROCESSING TESTER INFORMATION AND VISUALIZATION FOR PARAMETER WITH MULTIPLE DISTRIBUTIONS IN INTEGRATED CIRCUIT TECHNOLOGY DEVELOPMENT

(75) Inventors: Franklyn Shihyu Wu, San Francisco, CA (US); Shivananda S. Shetty, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 142 days.

(21) Appl. No.: 10/305,224

(22) Filed: Nov. 25, 2002

(51) Int. Cl.[7] .............................................. G01R 31/00
(52) U.S. Cl. ...................................... 702/120; 700/108
(58) Field of Search ........................ 702/108, 117–118, 702/120, 123, 179–181, 183; 438/14–18; 700/56–66, 108–110; 714/57, 724, 733–734

(56) References Cited

U.S. PATENT DOCUMENTS

| | | | | |
|---|---|---|---|---|
| 5,761,064 A | * | 6/1998 | La et al. | 700/110 |
| 6,480,810 B1 | * | 11/2002 | Cardella et al. | 702/188 |
| 6,532,428 B1 | * | 3/2003 | Toprac | 702/97 |
| 6,720,194 B1 | * | 4/2004 | Miller et al. | 438/14 |

* cited by examiner

Primary Examiner—Marc S. Hoff
Assistant Examiner—Mary Catherine Baran
(74) Attorney, Agent, or Firm—Mikio Ishimaru

(57) ABSTRACT

A system and method are provided for processing tester information including means of determining axis information and means of determining break information for the tester information. The axis information and the break information are applied to the tester information to provide disjointed tester information. The disjointed tester information is then plotted on a disjointed axis graph.

16 Claims, 5 Drawing Sheets

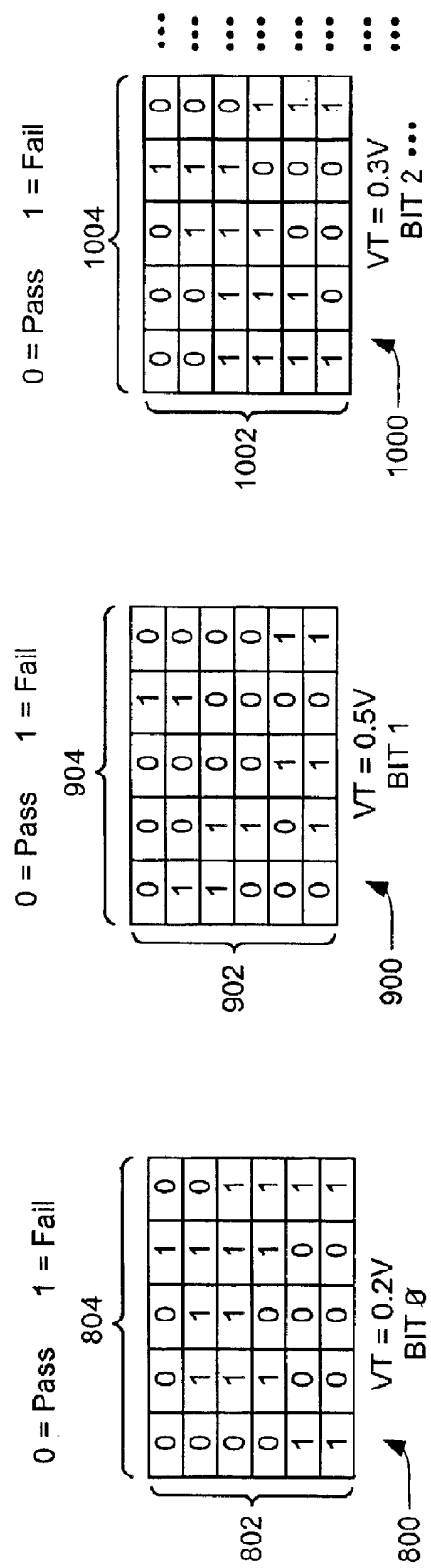

|     |     |     |     |     |
| --- | --- | --- | --- | --- |
| 0   | 0   | 0   | 1   | 0   |
| 1   | 0   | 0   | 1   | 0   |
| 1   | 1   | 0   | 0   | 0   |
| 0   | 1   | 0   | 0   | 0   |
| 0   | 0   | 1   | 0   | 1   |
| 0   | 1   | 1   | 0   | 1   |

Plane 1  $V_T = 0.5V$

|     |     |     |     |     |
| --- | --- | --- | --- | --- |
| 0   | 0   | 0   | 1   | 0   |
| 0   | 1   | 1   | 1   | 0   |
| 0   | 1   | 1   | 1   | 1   |
| 0   | 1   | 0   | 1   | 1   |
| 1   | 0   | 0   | 0   | 1   |
| 1   | 0   | 0   | 0   | 1   |

Plane 0  $V_T = 0.2V$

FIG. 11

| 000 | 000 | 000 | 111 | 000 |
| --- | --- | --- | --- | --- |
| 110 | 001 | 101 | 111 | 000 |
| 110 | 111 | 101 | 111 | 001 |
| 100 | 111 | 100 | 001 | 101 |
| 101 | 100 | 100 | 000 | 111 |
| 101 | 000 | 010 | 000 | 111 |

FIG. 12

SYSTEM AND METHOD FOR PROCESSING TESTER INFORMATION AND VISUALIZATION FOR PARAMETER WITH MULTIPLE DISTRIBUTIONS IN INTEGRATED CIRCUIT TECHNOLOGY DEVELOPMENT

BACKGROUND

1. Technical Field

The present invention relates generally to semiconductor technology and more specifically to semiconductor research and development.

2. Background Art

Today electronic products are used in almost every aspect of life, and the heart of these electronic products is the integrated circuit. Integrated circuits are used in everything from computers, radios, and televisions to CD players, cameras and microwaves.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the total number of integrated circuits formed on the wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers on processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes, but a few wafers are processed to reduce cost. The research and development environment has resulted in the generation of tremendous amounts of data and analysis for all the different processes and variations. This, in turn, has required a large number of engineers to do the analysis. With more data, the answer always has been to hire more engineers.

The problems include, but are not limited to, visualization of data where details are obscured by the large scales needed to display semiconductor electrical data information. The information has wide ranges and often multiple distributions. If all the data is plotted on the same graph, the graphs become too large. If the outliers are filtered out to reduce the size of the graphs, it is possible that some vital information might get lost with the filtered data.

The problems also include, but are not limited to, physical verification of modern semiconductor memories, which require verification of array organization and placement of every bit cell. The problems also include, but are not limited to, all the specification files having to be stored on a server with a format which only allows limits to be entered or changed one-by-one, manually, resulting in a tedious and time-consuming task. For example, WET specification limits which allow engineers to quickly determine if there are signs of excursions in the specification.

The problems also include, but are not limited to, the need to manually analyze memory failure maps produced under many different test stimuli, for example in semiconductor FLASH memories.

Solutions to these problems have been long sought but prior developments have not taught or suggested any solutions and, thus, solutions to these problems have long eluded those skilled in the art.

DISCLOSURE OF THE INVENTION

The present invention provides a method for processing tester information including a system and method of determining axis information. Break information is determined within the tester information. The axis information and the break information are applied to the tester information to provide disjointed tester information. The disjointed tester information is then plotted on a disjointed axis graph. The plotting of the data on a disjointed axis graph allows all of the data to be shown in one graph without obscuring distributions or losing vital data.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIGS. 8, 9, and 10, therein are shown failure bitmaps under different test stimuli;

FIG. 11 is the three-dimensional representation of two planes depicting various data for threshold voltage; and FIG. 12 is the equivalent of FIG. 11 in a single bitmap.

DETAILED DESCRIPTION OF THE INVENTION

Figure 1:
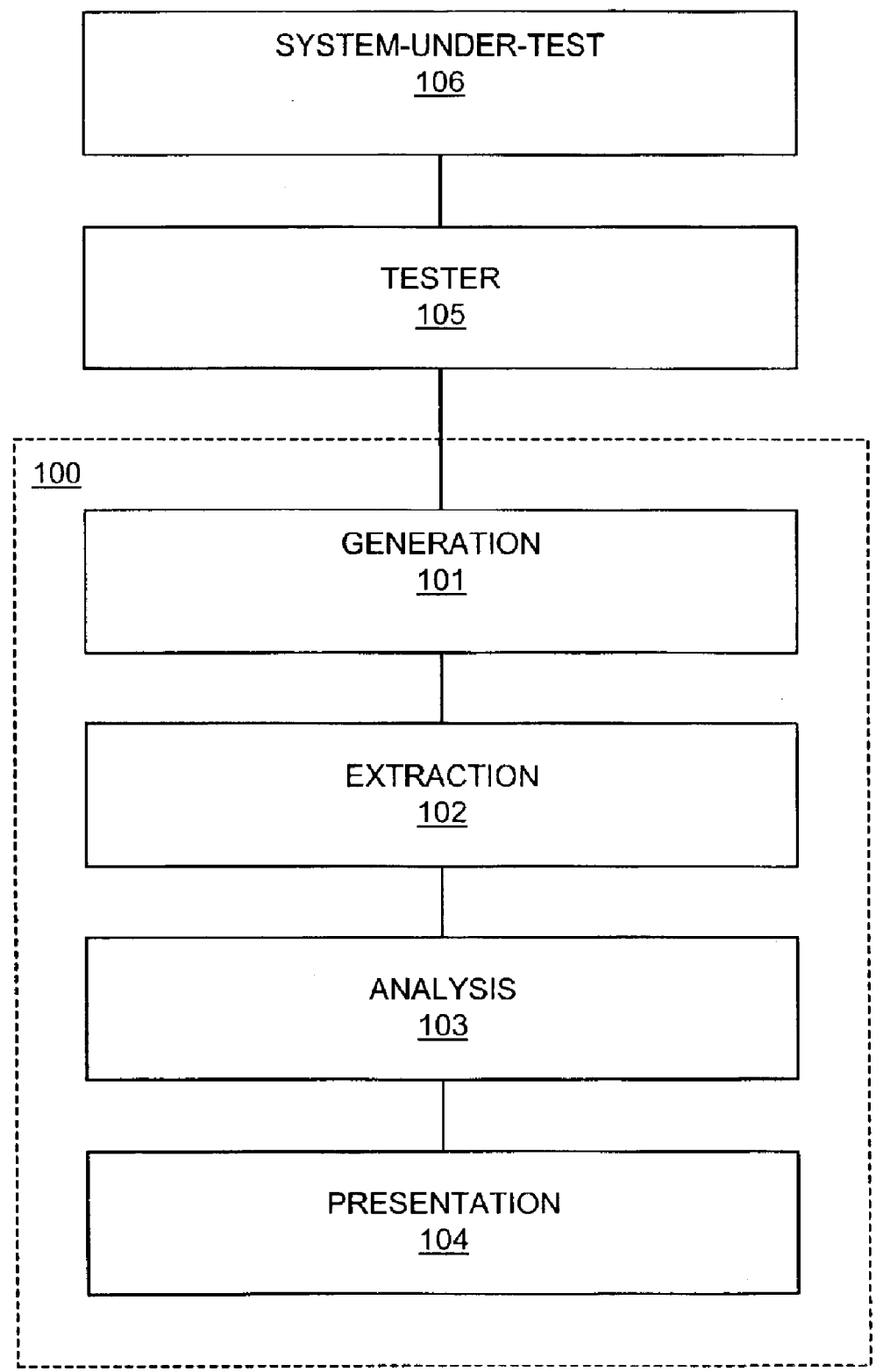
FIG. 1 is a block diagram of a tester information processing system according to the present invention.

Referring now to FIG. 1, therein is shown a block diagram of a tester information processing system 100 according to the present invention. The tester information processing system 100 is the result of the discovery that at times a single fundamental block can solve the problems presented but often there are four fundamental blocks to solving the problems presented.

The four fundamental blocks are generation block 101, extraction block 102, analysis block 103, and presentation block 104. Each of the blocks can stand independently in the tester information processing system 100, and within these blocks are various commercially available techniques, methodologies, processes, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, which operate on and manipulate information and/or data, which are generically defined herein as "information". The tester information processing system receives information from a tester 105, which is connected to a system-under-test 106.

In the integrated circuit field, the tester 105 can be a semiconductor test system for testing wafers or die and the system-under-test 106 can be anything from a complete wafer down to an element of an individual semiconductor device on a die.

In generation block 101, basic information is generated looking at new and old products, new and old processes, product and process problems, unexpected or unpredictable results and variations, etc. Generation of the information may use the tester 105 itself, a conventional test information, a personal computer, etc. It may also require new equipment and/or methods, which are described herein when required.

In extraction block 102, usable information is extracted from the generated information from the generation block 101. Essentially, the generated information is translated into more useful forms; e.g., broken apart so it can be reassembled in different forms to show different inter-relationships.

For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In analysis block 103, the usable information from the extraction block 102 is analyzed. Unlike previous systems where a few experiments were performed and/or a relatively few data points determined, the sheer volume of experiments and data precludes easy analysis of trends in the data or the ability to make predictions based on the data. Analysis of the extracted information may also require new equipment and/or methods, which are described herein when required.

In presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

Figure 2:
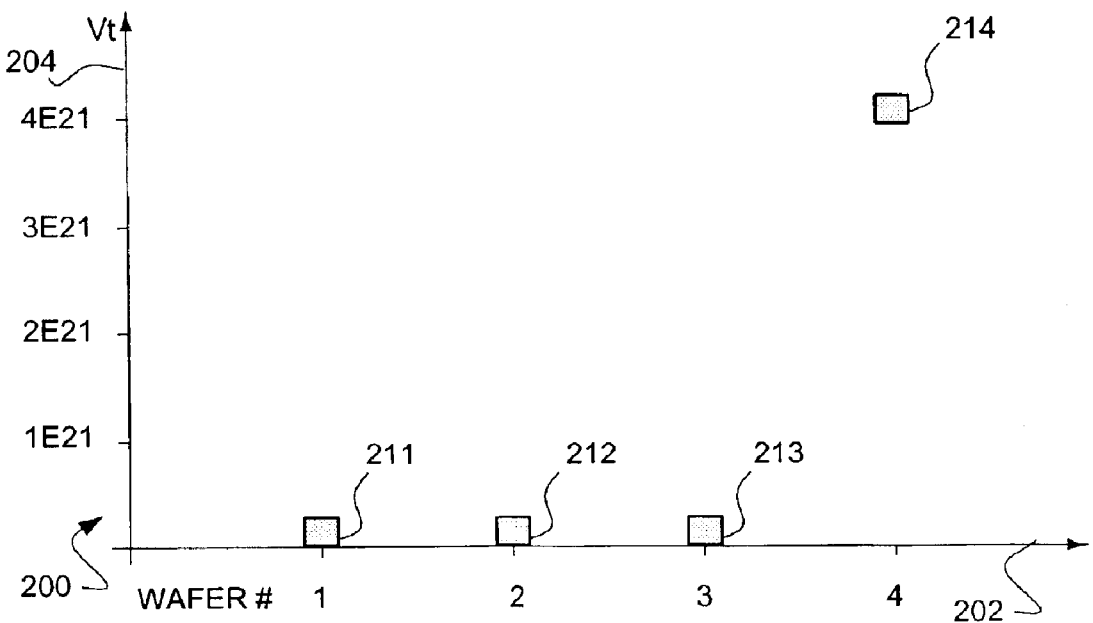
FIG. 2 (PRIOR ART) is an example of a conventional two-axis box plot.

Visualization of Parameter:

Referring now to FIG. 2 (PRIOR ART), therein is shown an example of a conventional two-axis box plot 200. The box plot 200 is plotted in a plotter in the presentation block 104.

The box plot 200 has a first axis 202, which is an x-axis having particular wafers, such as wafers 1 through 4. The box plot 200 has a second axis 204, which is a y-axis having threshold voltage values 1E21 through 4E21 of a plurality of cells in each of the wafers 1 through 4.

The tester 106 will output data for a wafer that fall into blocks or boxes 211 through 214. It will be noted that the boxes 211 through 213 show the respective wafers 1 through 3 have threshold voltages, which fall very closely together, but that the box 214 shows the wafer 4 having threshold voltages, which are higher than the other wafers.

In the box plot 200, the fixed scale of the second axis 204 means that the boxes 211 through 214 are so short that individual data points cannot be distinguished within a box in order to assure that the box 214 will appear.

Figure 3:
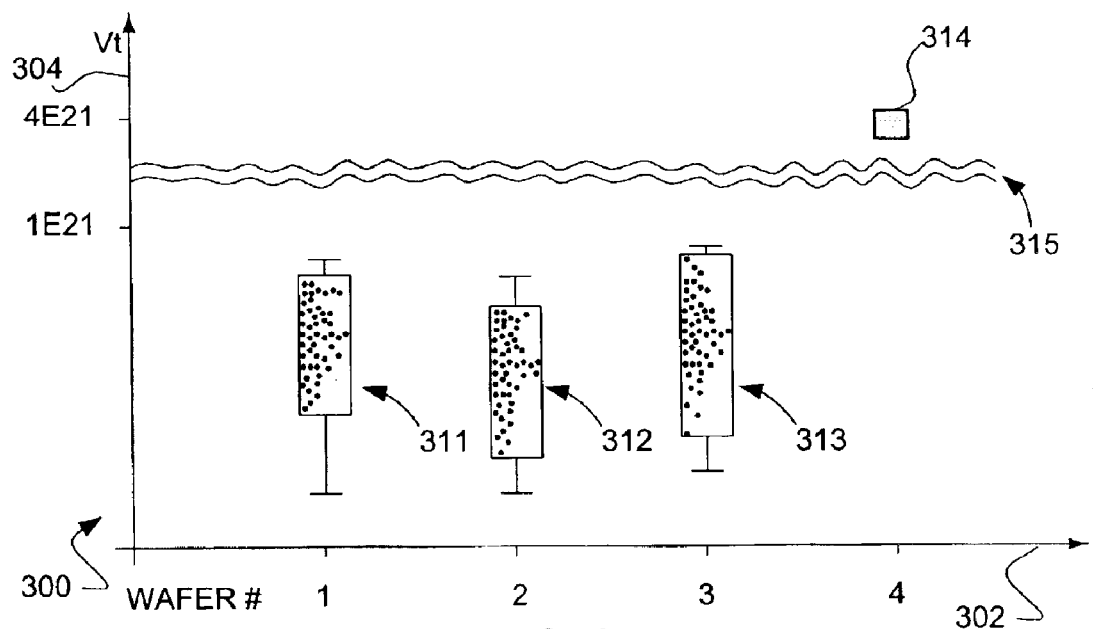
FIG. 3 is an example of a two-axis box plot in accordance with the present invention.

Referring now to FIG. 3, therein is shown an example of a two-axis box plot 300 in accordance with the present invention. The example shows a single parameter with multiple distributions although multiple parameters with single or multiple distributions may be visualized in the same manner. The box plot 300 is also plotted in a conventional plotter or printer in the presentation block 104.

The box plot 300 has a first axis 302, which is an x-axis having particular wafers, such as wafers 1 through 4. The box plot 300 has a second axis 304, which is a y-axis having threshold voltage values 1E21 disjointedly through 4E21 of a plurality of cells in each of the wafers 1 through 4.

The tester 106 will output data for a wafer that fall into blocks or boxes 311 through 314. It will be noted that the boxes 311 through 313 show the respective wafers 1 through 3 have threshold voltages, which fall very closely together, but that the box 314 shows the wafer 4 having threshold voltages, which are higher than the other wafers.

However, in accordance with the present invention, the box plot 300 is disjointed and has a break 315 in the scale of the second axis 304. The break 315 separates the boxes 311 through 313 from the box 314 in such a way that the boxes 311 and 313 can have the data in an increased scale so the individual data points can be distinguished.

The box 314 is shown in the non-increased scale, but it would be understood from the present disclosure that it could also have a localized increased scale applied. Thus, the box plot 300 shows the box 314, which would be considered an outlier and be filtered out when an increased scale is used for all the data.

While the invention has been described in conjunction with a two-axis box plot, it would also be understood from the present disclosure that the invention is also applicable to all charts and graphs including single and multi-dimensional charts as well as non-box plots.

Figure 4:
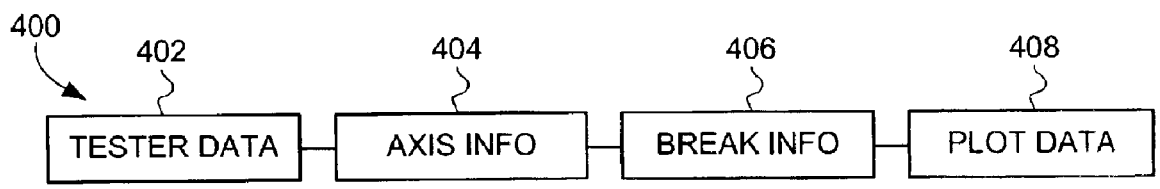
FIG. 4 is a simplified flowchart of the method in accordance with the present invention.

Referring now to FIG. 4, therein is shown a simplified flowchart of the method in accordance with the present invention. It will be understood from the disclosure herein that the method can be performed on a general-purpose computer, such as a personal computer (PC) or by circuitry which is commercially available or can be manufactured to perform the operations described without undue experimentation.

As a result, it will be understood that each block in the method can be performed by various circuitry, which performs the operation described. Thus, FIG. 4 will be understood as relating to a system/method 400, which includes: a tester data block 402 of receiving data from the tester; an axis info block 404 of determining the axis information of the chart on which the tester data is to be plotted; a break block 406 of determining where the break or breaks should occur based on the tester data; and a plot data block 408 of applying the axis information and the break information to the tester data to provide the plot of the tester data. The present invention allows easy visualization of any particular parameter involved.

Figure 5:
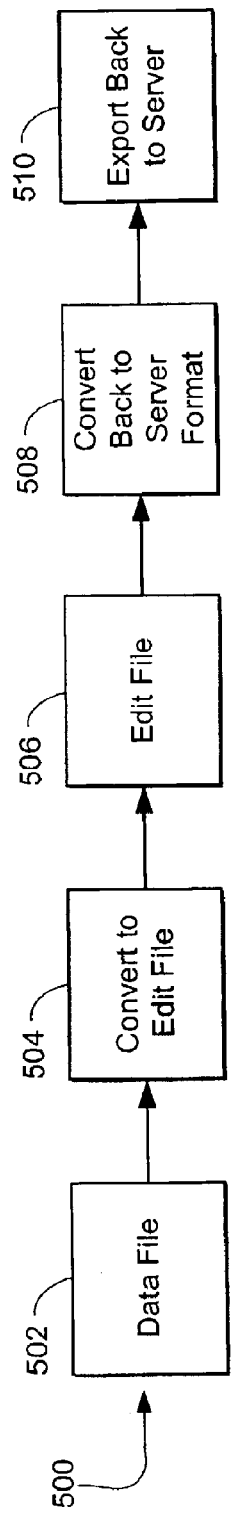
FIG. 5 is an example of a method for updating WET test specification limit files.

Updating WET Test Specification Limit Files:

Referring now to FIG. 5, therein is shown a method 500 for updating WET test specification limit files.

The method 500 begins with a data file block 502 of extracting the WET specification limit files from a server. For example, where the WET specification limit files are on a VAX server, the extraction can be performed by a FTP "get" function.

The method 500 includes a convert to edit file block 504 where extracted files are exported and converted into an editable file, such as an Excel file, where browsing and editing is simplified.

The method 500 also includes an edit file block 506 where the Excel file can be edited to update the WET test specification limits.

The method 500 further includes a convert back to server format block 508 where the editable file is converted back to the server format. For example, the Excel file would be converted back to a VAX format.

The method 500 still further includes an export back to server block 510 of exporting the specification limit files back to the server, such as by FTP to a VAX server.

Figure 6:
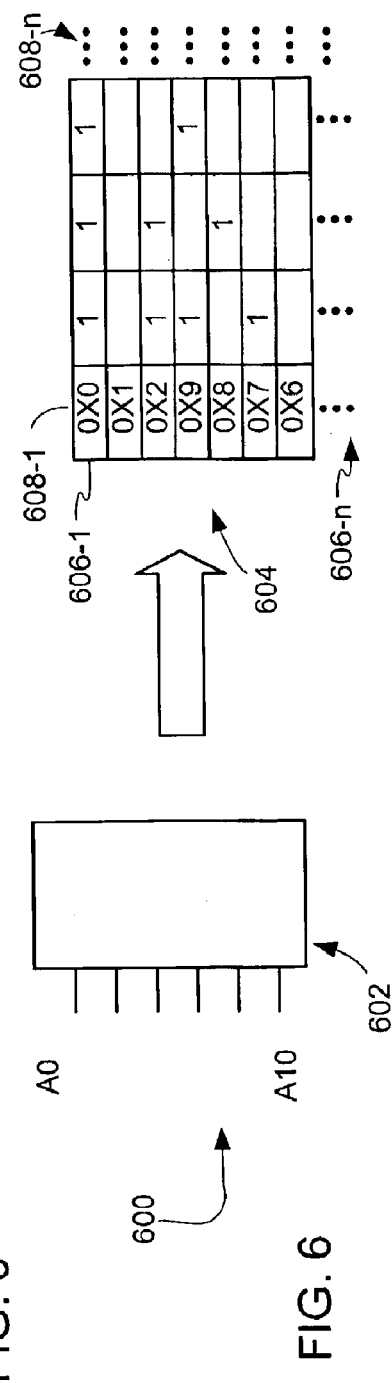
FIG. 6 is a schematic illustration of the process of topological scrambling.

Physical Verification of Semiconductor Memory:

Referring now to FIG. 6, therein is shown a schematic illustration of the process of topological scrambling 600. During semiconductor memory design (digital), logical memory addresses 602 must be mapped to physical array locations 604 having rows 606-1 through 606-N and columns 608-1 through 608-N.

For example, in FIG. 6, it is necessary that the physical array location (0,0) in row 206-1 and column 208-1 will be accessed by logical address 0X0, etc.

Figure 7:
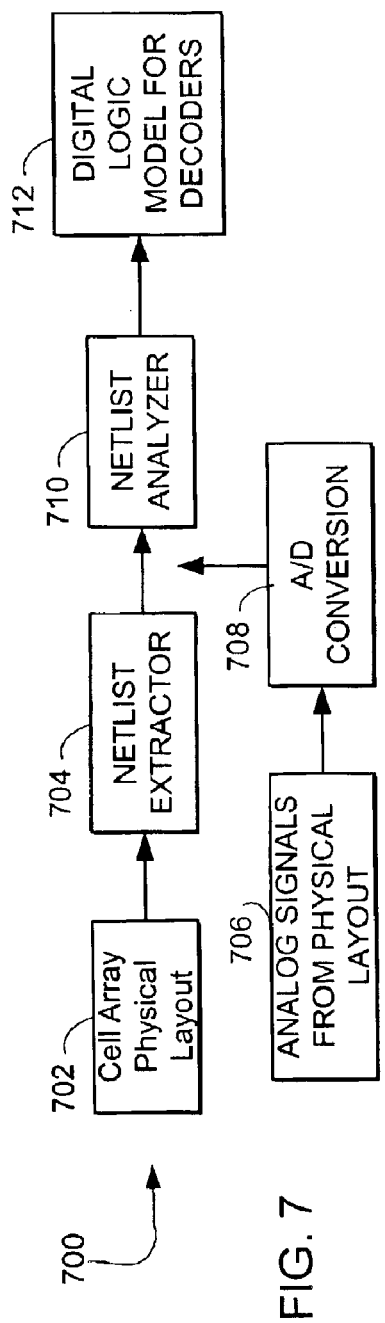
FIG. 7 is a design flow for automating the verification of topological scrambling in accordance with the present invention.

Referring now to FIG. 7, therein is shown a design flow 700 for automating the verification of topological scrambling in accordance with the present invention. A cell array physical layout 702 is provided to a netlist extractor 704. Analog signals from the physical layout 706 are subject to analog-to-digital conversion 708 and provided with the netlist from the netlist extractor 704 to a netlist analyzer 710 and then to a digital logic model for the decoders 712.

When the digital logic model for the decoders 712 is complete as extracted from the physical layout 706, the physical-to-logical mapping can be built for the physical array 604 of FIG. 2. The logical-to-physical scrambling maps based on the extracted logic can then be input to test and navigation systems to verify the physical design of the physical array 604.

Storing Multiple Cell Failure Maps for Efficient Failure Analysis:

Referring now to FIGS. 8, 9, and 10, therein are shown failure bitmaps under different test stimuli. FIG. 8 depicts a bitmap 800 having rows 802 and columns 804. FIG. 9 depicts a bitmap 900 having rows 902 and columns 904. FIG. 10 depicts a bitmap 1000 having rows 1002 and columns 1004.

In the examples of FIGS. 8 through 10, each bitmap 800, 910, and 1020 depicts the cells that fail with the reference cells (used to compare array $V_t$) with the threshold voltage programmed respectively to $V_t$=0.2, 0.3, and 0.5 volts. By storing all the bitmaps 800, 910, and 1020 using bit plane encoding, all the bitmaps can be efficiently stored in a single image file.

Referring now to FIG. 11, therein is shown the three-dimensional representation of two planes depicting various data for threshold voltage. The three-dimensional perspective chart 1100 shows a plane 0 having a first plane 1102 for a threshold voltage of 0.2 volts with the data test results. A second plane 1104 is shown above the plane 1102 for the data results from a threshold voltage of 0.5 volts also having the resulting data.

Referring now to FIG. 12, therein is shown the equivalent to FIG. 11 in a single bitmap 1200 having columns 1202 and rows 1204. It will be noted that the three digits could be represented by three colors such as R/G/B where R=red, G=green, and B=blue. Further, each of the colors could have a number of bits to resolve various shades of the color: e.g., 8 bits. This would greatly aid interpretation of the bitmap 1200.

While the invention has been described in conjunction with specific best modes, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method for processing tester information comprising:
    determining axis information for the tester information;
    determining break information from the tester information wherein determining the break information includes determining the break information between box plot data;
    applying the axis information and the break information to the tester information to provide disjointed tester information; and
    plotting the disjointed tester information.

2. The method as claimed in claim 1 wherein determining the axis information determines axis information for one axis.

3. The method as claimed in claim 1 wherein determining the axis information determines information for a plurality of axes.

4. The method as claimed in claim 1 wherein plotting the disjointed tester information provides a disjointed box plot.

5. A method for processing tester information comprising:
providing the tester information as one parameter and a plurality of distributions, as one distribution with a plurality of parameters, or as a plurality of parameters with a plurality of distributions;
determining axis information for the tester information including determining a scale and a range;
determining break information from the tester information including determining spaces between tester information and groups of tester information wherein determining the break information includes determining the break information between box plot data and having a box plot at a larger scale than the scale;
applying the axis information and the break information to the tester information to provide a larger scale than the scale and to provide disjointed tester information; and
plotting the disjointed tester information.

6. The method as claimed in claim 5 wherein determining the axis information determines axis information for one axis and one parameter along the one axis.

7. The method as claimed in claim 5 wherein determining the axis information determines information for a plurality of axes and one parameter along one of the plurality of axes.

8. The method as claimed in claim 5 wherein plotting the disjointed tester information provides a disjointed box plot at a smaller scale than the scale.

9. A tester information processing system comprising:
first means for determining axis information for the tester information;
second means for determining break information from the tester information wherein second means for determining the break information includes means for determining the break information between box plot data;
third means for applying the axis information and the break information to the tester information to provide disjointed tester information; and
a plotter for plotting the disjointed tester information.

10. The tester information processing system as claimed in claim 9 wherein the first means for determining the axis information includes means for determining axis information for one axis.

11. The tester information processing system as claimed in claim 9 wherein first means for determining the axis information includes means for determining axis information for a plurality of axes.

12. The tester information processing system as claimed in claim 9 wherein the plotter for plotting the disjointed tester information provides a disjointed box plot.

13. A tester information processing system comprising;
circuitry for providing the tester information as one parameter and a plurality of distributions, as one distribution with a plurality of parameters, or as a plurality of parameters with a plurality of distributions;
axis information circuitry for determining axis information for the tester information including circuitry for determining a scale and a range;
break information circuitry for determining from the tester information including circuitry for determining spaces between tester information and groups of tester information wherein the break information circuitry includes circuitry for determining the break information between box plot data and having a box plot at a larger scale than the scale;
circuitry for applying the axis information and the break information to the tester information to provide a larger scale than the scale and to provide disjointed tester information; and
a plotter for plotting the disjointed tester information.

14. The tester information processing system as claimed in claim 13 wherein the axis information circuitry includes circuitry for determining axis information for one axis and one parameter along the one axis.

15. The tester information processing system as claimed in claim 13 wherein the axis information circuitry includes circuitry for determining information for a plurality of axes and one parameter along one of the plurality of axes.

16. The tester information processing system as claimed in claim 13 wherein the plotter for plotting the disjointed tester information provides a disjointed box plot at a smaller scale than the scale.

* * * * *

UNITED STATES PATENT AND TRADEMARK OFFICE
CERTIFICATE OF CORRECTION

PATENT NO. : 6,907,379 B1
DATED : June 14, 2005
INVENTOR(S) : Wu et al.

It is certified that error appears in the above-identified patent and that said Letters Patent is hereby corrected as shown below:

Column 2,
Line 8, delete "but a" and insert therefor -- but only a --.
Line 15, before "The problem" insert the following sentence as a separate paragraph -- However, this has not been the answer to some of the major problems. --.

Column 8,
Line 12, delete "comprising;" and insert therefor -- comprising: --.

Signed and Sealed this

Thirtieth Day of August, 2005

JON W. DUDAS
*Director of the United States Patent and Trademark Office*